United States Patent
Hong et al.

(10) Patent No.: US 10,840,164 B2
(45) Date of Patent: Nov. 17, 2020

(54) WIRE BONDED PACKAGE WITH SINGLE PIECE EXPOSED HEAT SLUG AND LEADS

(71) Applicant: Infineon Technologies AG, Neubiberg (DE)

(72) Inventors: Chii Shang Hong, Melaka (MY); Edmund Sales Cabatbat, Roxas (PH); Lee Shuang Wang, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/983,621

(22) Filed: May 18, 2018

(65) Prior Publication Data

US 2019/0355643 A1 Nov. 21, 2019

(51) Int. Cl.
*H01L 23/367* (2006.01)
*H01L 23/495* (2006.01)
*H01L 23/498* (2006.01)
*H01L 23/00* (2006.01)

(52) U.S. Cl.
CPC ........ *H01L 23/367* (2013.01); *H01L 23/4951* (2013.01); *H01L 23/49575* (2013.01); *H01L 23/49805* (2013.01); *H01L 24/83* (2013.01); *H01L 24/95* (2013.01)

(58) Field of Classification Search
None
See application file for complete search history.

(56) References Cited

U.S. PATENT DOCUMENTS

| 6,307,755 B1* | 10/2001 | Williams | H01L 24/03 361/813 |
| 7,800,217 B2* | 9/2010 | Otremba | H01L 23/49524 257/700 |
| 2003/0075786 A1 | 4/2003 | Joshi et al. | |
| 2004/0080028 A1* | 4/2004 | Yanagisawa | H01L 23/4334 257/675 |
| 2005/0218498 A1* | 10/2005 | Hata | H01L 24/33 257/690 |

(Continued)

OTHER PUBLICATIONS

Bajuri, Mohd et al., "Semiconductor Package with Heat Slug and Rivet Free Die Attach Area", U.S. Appl. No. 15/412,108, filed Jan. 23, 2017, 1-40.

(Continued)

*Primary Examiner* — Nishtah Yasmeen
(74) *Attorney, Agent, or Firm* — Murphy, Bilak & Homiller, PLLC

(57) ABSTRACT

A semiconductor device package includes an electrically conductive die pad having a die attach surface and an outer surface. A semiconductor die is mounted on the die attach surface. An encapsulant material encapsulates the semiconductor die and exposes the outer surface of the die pad. A first lead directly contacts the die pad, extends away from a first sidewall of the encapsulant material, and bends towards a lower side of the encapsulant material. A second lead is electrically connected to a terminal of the semiconductor die, extends away from a second sidewall of the encapsulant material, and bends towards the lower side of the encapsulant material. A first lateral section of the first lead that intersects the first sidewall is vertically offset from a second lateral section of the second lead that intersects the second sidewall.

18 Claims, 9 Drawing Sheets

(56) References Cited

U.S. PATENT DOCUMENTS

| | | |
|---|---|---|
| 2007/0090463 A1 | 4/2007 | Xiaochun |
| 2007/0278632 A1 | 12/2007 | Zhao et al. |
| 2010/0193920 A1 | 8/2010 | Poh et al. |
| 2013/0009295 A1* | 1/2013 | Otremba ............ H01L 23/49524 257/676 |
| 2014/0264611 A1* | 9/2014 | Lee ......................... H01L 24/40 257/368 |
| 2014/0273344 A1* | 9/2014 | Terrill .................... H01L 21/565 438/107 |

OTHER PUBLICATIONS

Ho, Kar et al., "Rivetless Lead Fastening for a Semiconductor Package", U.S. Appl. No. 15/727,725, filed Oct. 9, 2017, 1-53.

* cited by examiner

WIRE BONDED PACKAGE WITH SINGLE PIECE EXPOSED HEAT SLUG AND LEADS

TECHNICAL FIELD

The present invention generally relates to semiconductor device packaging and more particularly relates to a semiconductor package with a thermally conductive heat slug and a corresponding method of making the semiconductor package.

BACKGROUND

Semiconductor packages are commonly used to house and protect semiconductor dies from a variety of different semiconductor technologies including silicon, silicon carbide (SiC), gallium nitride (GaN), etc. These semiconductor dies can be configured with a variety of different device types, such as microprocessors, discrete devices, amplifiers, controllers, sensors, etc. In a semiconductor package, the semiconductor die is mounted to a die pad. The semiconductor package typically includes an electrically insulating encapsulant material, such as plastic or ceramic, that seals and protects the integrated circuits from moisture and dust particles. Electrically conductive leads are connected to the various terminals of the encapsulated integrated circuit (or circuits) and are accessible outside the semiconductor package. In a so-called lead-frame style package, the die pad and the leads are provided together from a lead frame.

In some package designs, the die pad portion of the lead frame is configured as a so-called "heat slug" or "heat sink." These die pads are designed to extract heat from the integrated circuit during operation of the integrated circuit and to transfer this heat to an external heat dissipating element, such as an external heat sink. Typically, the heat slug is formed from a thermally conductive material (e.g., metal). In some package configurations, the package die pad also serves as an electrical terminal that provides a reference potential (e.g., ground) to the encapsulated integrated circuit (or circuits).

In some package designs, the package die pad has a so-called downset configuration. According to this design, the die pad, i.e., the portion of the package upon which semiconductor dies are mounted, sits between bent leads that bend downward as they approach the die pad. An example of such a design is described in U.S. Patent Publication Number 2010/0193920 A1 to Poh, the content of which is incorporated by reference in its entirety.

Designers are continuously seeking to improve packaging designs. One notable design consideration that is gaining considerable attention is the total footprint of the package. As technology progresses, there is a strong demand to reduce the size and/or cost of most electronic components. Another notable design consideration is heat dissipation. Heat consumption per area of modern semiconductor devices continues to increase as devices become faster and more powerful while simultaneously becoming smaller. As a result, there is much greater emphasis on cooling solutions to prevent modern integrated circuits from failure or decreased performance due to overheating. The desire to reduce the total footprint of the package often conflicts with the desire to improve the heat dissipation capability of semiconductor packages, as larger heat sinks are conventionally used to provide more cooling.

SUMMARY

A semiconductor device package is disclosed. According to an embodiment, the semiconductor device package includes an electrically conductive die pad having a die attach surface and an outer surface opposite the die attach surface. A semiconductor die is mounted on the die attach surface. An encapsulant material encapsulates the semiconductor die and exposes the outer surface of the die pad at an upper side of the encapsulant material body. A first lead directly contacts the die pad, extends away from a first sidewall of the encapsulant material, and bends towards a lower side of the encapsulant material body that is opposite the upper side. A second lead is electrically connected to a terminal of the semiconductor die, extends away from a second sidewall of the encapsulant material that is opposite the first sidewall, and bends towards the lower side of the encapsulant material body. A first lateral section of the first lead that intersects the first sidewall is vertically offset from a second lateral section of the second lead that intersects the second sidewall.

According to another embodiment, the semiconductor device package includes a semiconductor die. An encapsulant material encapsulates the semiconductor die. An integrally formed electrically conductive structure provides a die pad and a first lead for the semiconductor device package. A second lead that is partially encapsulated by the encapsulant material body and is detached from the die pad. The semiconductor die includes a first terminal that faces and is electrically connected to the die pad and a second terminal facing away from the die pad that is electrically connected to the second lead. The first and second leads intersect with first and second opposite facing sidewalls of the encapsulant material, respectively, at locations that are vertically offset from one another.

A method of forming a semiconductor device package is disclosed. According to an embodiment, the method includes providing an electrically conductive die pad having a die attach surface and an outer surface opposite the die attach surface. A semiconductor die is mounted on the die attach surface. An encapsulant material that encapsulates the semiconductor die and exposes the outer surface of the die pad at an upper side of the encapsulant material is formed. A first lead that directly contacts the die pad, extends away from a first sidewall of the encapsulant material body, and bends towards a lower side of the encapsulant material that is opposite the upper side is provided. A second lead that is electrically connected to a terminal of the semiconductor die, extends away from a second sidewall of the encapsulant material that is opposite the first sidewall, and bends towards the lower side of the encapsulant material is provided.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, depicts the semiconductor device package of FIG. 1, according to an embodiment. FIG. 2A depicts the semiconductor device package from a plan-view perspective. FIG. 2B depicts the semiconductor device package from an isometric view perspective.

DETAILED DESCRIPTION

Embodiments of a packaged semiconductor device are described herein. The packaged semiconductor device has several notable advantages. For example, the packaged semiconductor device maximizes the ratio between the heat slug area and the encapsulant material volume. This is attributable the provision of a single piece combined die-pad and lead that is exposed at the entire upper surface of the package. In addition, the packaged semiconductor device maximizes the ratio between the size of the die and the overall size of the encapsulant material. For example, according to one advantageous embodiment, the heat slug of the package extends completely to the sidewall of the encapsulant material. This design allows the semiconductor die to be located very close to the side of the package. As a result, a more favorable tradeoff between heat dissipation and space efficiency is achieved in comparison to a so-called downset design, which requires spacing between the die pad and the edge of the encapsulant material for the downset (bent) portions of the leads.

The space efficiency and high thermal performance of the presently disclosed embodiments is attributable to, among other things, a vertically offset lead design. Advantageously, the techniques described herein produce this vertically offset lead design with a single lead frame. In one example, the packaged semiconductor device includes first and second leads that extend away from the package in opposite directions and are vertically offset from one another. The first and second leads each include lateral sections that intersect with the encapsulant body at different vertical locations. For instance, the first lead may intersect the encapsulant body at a higher location, i.e., a location that is closer to the upper side of the package than the second lead. The vertical positioning of the first lead allows the heat slug to extend directly along a single plane from within the package to meet the first lead at the sidewall of the encapsulant body. In one advantageous embodiment, the heat slug and the first lead are part of a single, integrally formed metal structure. An inward facing surface of this structure provides a large die attach surface that extends to a sidewall of the encapsulant body. An outward facing surface of this structure is exposed at the upper surface of the package and provides a large surface area for the mounting of a heat sink thereon.

Figure 1:
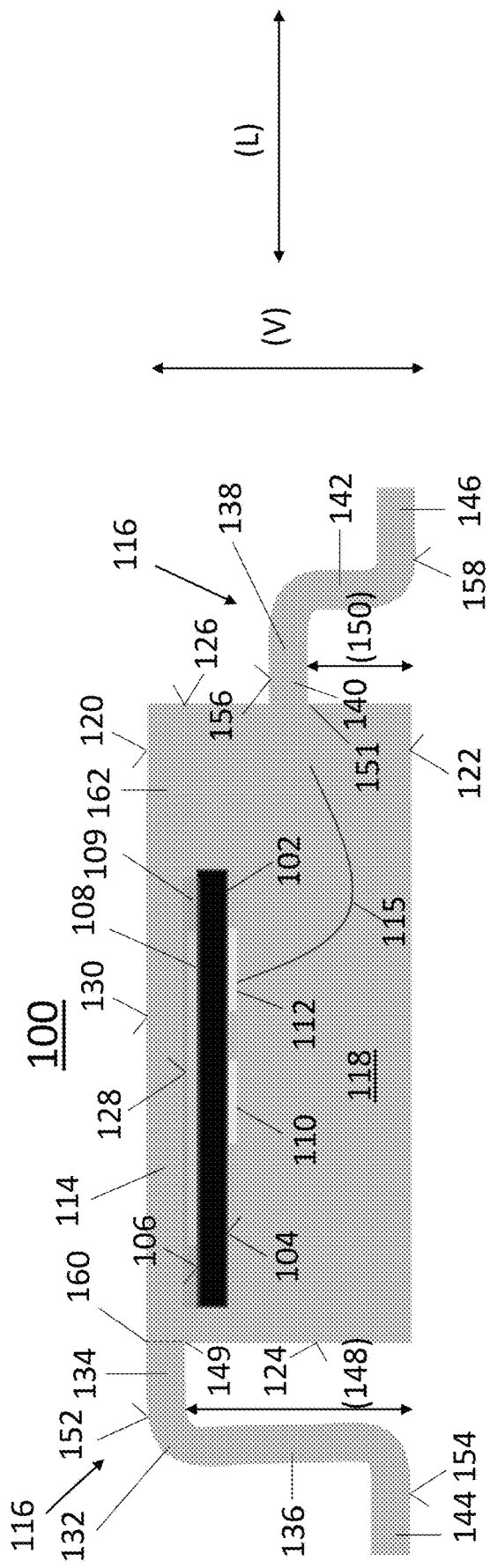
FIG. 1 depicts a cross-sectional view of a semiconductor device package, according to an embodiment.

Referring to FIG. 1, a semiconductor device package 100 is depicted, according to an embodiment. The semiconductor device package 100 includes at least one semiconductor die 102. Generally speaking, the semiconductor die 102 can be configured as any kind of transistor such as a MOSFET (metal-oxide semiconductor field-effect transistor), an LDMOS (laterally-diffused metal-oxide semiconductor) device, an HEMT (high electron mobility transistor) device, etc. More generally, the semiconductor die 102 can be configured as any of a wide variety of devices, e.g., diodes, thyristors, etc. The semiconductor die 102 can be configured as a vertical device that is configured to conduct in a direction perpendicular to upper and lower surfaces 104, 106 of the semiconductor die 102 or as a lateral device that is configured to conduct in a direction that is parallel to the upper and lower surfaces 104, 106 of the semiconductor die 102. Moreover, instead of a single semiconductor die 102 as shown in the depicted embodiment, the packaged semiconductor device can include any number of the above described semiconductor dies 102, e.g., one, two, three, four, etc.

For the purposes of the following discussion, the semiconductor die 102 is configured as a vertical transistor with a drain terminal 108 disposed on the lower surface 106 of the semiconductor die 102 and gate and source terminals 110, 112 disposed on the upper surface 104 of the semiconductor die 102. The drain terminal 108 directly faces and electrically connects to an electrically conductive die pad 114. An adhesive 109, such as a solder, sinter or conductive glue may be provided between or around the drain terminal 108 to provide this connection. The source and gate terminals 110, 112 are electrically connected to electrically conductive leads 116 by electrically conductive bond wires 115. In FIG. 1, the connection between the gate terminal 112 and one of the electrically conductive leads 116 is shown. In another cross-section of the device, a similar connection between the source terminal 110 and one of the electrically conductive leads 116 is provided.

The semiconductor device package 100 includes an electrically insulating encapsulant body 118. The encapsulant body 118 encapsulates the semiconductor die 102 with an electrically insulating material, e.g., ceramic, plastic, etc. This material can be molded, e.g., by an injection or transfer molding process in one example. The encapsulant body 118 completely covers the semiconductor die 102 so as to protect the semiconductor die 102 as well as any associated electrical connections to the semiconductor die 102 from the exterior environment.

The encapsulant body 118 includes an upper side 120 and a lower side 122 that is opposite the upper side 120. Both the upper side 120 and the lower side 122 of the encapsulant body 118 may be substantially planar surfaces. First and second sidewalls 124, 126 of the encapsulant body 118 are disposed opposite one another and extend between the upper and lower sides 120, 122. In the following description, a vertical direction (V) of the semiconductor device package 100 refers to a direction that is substantially perpendicular to the upper and lower sides 120, 122 of the encapsulant body 118. Further, a lateral direction (L) refers to a direction that is perpendicular to the vertical direction (V), i.e., a direction that is substantially parallel to the upper and lower sides 120, 122 of the encapsulant body 118.

The die pad 114 is an electrically conductive and optionally thermally conductive structure. The die pad 114 includes a die attach surface 128 and an outer surface 130 that is opposite the die attach surface 128. Both the die attach surface 128 and the outer surface 130 may be substantially planar. That is, each of these surfaces can extend along a single plane. The semiconductor die 102 is mounted on the die attach surface 128 with an electrically conductive adhesive (e.g., solder) providing adhesion and electrical connection between the drain terminal 108 and the die pad 114. In this configuration, the die pad 114 can be configured as a so-called heat slug, wherein a cooling device, e.g., a heat sink (not shown) is placed directly on top of the device package and used to remove heat generated by the semiconductor die 102 during operation of the semiconductor device package 100.

The semiconductor device package 100 includes a first electrically conductive lead 132. The first lead 132 directly contacts the die pad 114. Thus, the first lead 132 is directly electrically connected to the drain terminal 108 of the semiconductor die 102 via the die pad 114. Moreover, this electrical connection is provided without the use of any intervening electrical connection mechanisms, e.g., bond wires, ribbons, etc. According to an embodiment, the first lead 132 and the die pad 114 are part of a single, integrally formed structure. That is, the first lead 132 and the die pad 114 are formed from a continuous piece of conductive material, e.g., metal. Alternatively, the first lead 132 can be a discrete structure that is attached to the die pad 114 using an electrically conducive adhesive, e.g., solder, sinter, etc.

The first lead 132 extends away from the first sidewall 124 of the encapsulant body 118, and bends towards the lower side 122 of the encapsulant body 118. More particularly, the first lead 132 includes a first lateral section 134 that intersects the first sidewall 124 and extends away from the first sidewall 124 in the lateral direction (L). That is, the first lateral section 134 is oriented transverse to the first sidewall 124. The first lead 132 additionally includes a first vertical section 136. The first vertical section 136 forms a bent intersection with the first lateral section 134. That is, the first vertical section 136 directly adjoins and forms an angle with the first lateral section 134. The first vertical section 136 extends substantially vertically (i.e., in the vertical direction (V)) towards the lower side 122 of the semiconductor device package 100. That is, the first vertical section 136 is oriented transverse to the upper and lower sides 120, 122 of the encapsulant body 118. In one embodiment, the first lateral section 134 is substantially parallel to the upper side 120 of the encapsulant body 118 and the first vertical section 136 is substantially perpendicular to the upper side 120 of the encapsulant body 118. More generally, the first lateral section 134 and the first vertical section 136 can be oriented at different angles relative to one another and to the first sidewall 124, provided that the first lead 132 has a bent lead configuration.

The semiconductor device package 100 includes a second electrically conductive lead 138. The second lead 138 extends away from the second sidewall 126 of the encapsulant body 118, and bends towards the lower side 122 of the encapsulant body 118. More particularly, the second lead 138 includes a second lateral section 140 that intersects the second sidewall and extends away from the second sidewall in the lateral direction (L). That is, the second lateral section 140 is oriented transverse to the second sidewall 126. The second lead 138 additionally includes a second vertical section 142. The second vertical section 142 forms a bent intersection with the second lateral section 140. That is, the second vertical section 142 directly adjoins and forms an angle with the second lateral section 140. The second vertical section 142 extends vertically (i.e., in the vertical direction (V)) towards the lower side 122 of the semiconductor device package 100. That is, the second vertical section 142 is oriented transverse to the upper and lower sides 120, 122 of the encapsulant body 118. In one embodiment, the second lateral section 140 is substantially parallel to the upper side 120 of the encapsulant body 118 and the second vertical section 142 is substantially perpendicular to the upper side 120 of the encapsulant body 118. More generally, the second lateral section 140 and the second vertical section 142 can be oriented at different angles relative to one another and to the second sidewall 126, provided that the second lateral section 140 has a lateral component to its extension and the second vertical section 142 has a vertical component to its extension.

Optionally, the first lead 132 can include a third lateral section 144 that forms an angled intersection with the first vertical section 136 and extends laterally away from the first sidewall 124 of the encapsulant body 118. Likewise, the second lead 138 can include a fourth lateral section 146 that forms an angled intersection with the second vertical section 142 and extends laterally away from the second sidewall 126 of the encapsulant body 118. The third and fourth lateral sections 144, 146 can be parallel to or close to parallel with the lower side 122 of the encapsulant body 118. This lead configuration produces one example of a so-called "surface-mount" package type configuration. Other examples of so-called "surface mount packages" that are possible are J and C type lead configurations. In another example, the third and fourth lateral sections 144, 146 can be omitted and, optionally, the first and second vertical sections 136, 142 can be extended past the lower side 122 of the encapsulant body 118. This lead configuration produces a so-called "through hole" package type configuration. More generally, the semiconductor device package 100 can have any bent lead configuration.

The first lateral section 134 of the first lead 132 is vertically offset from the second lateral section 140 of the second lead 138. This means that a distance 148 between the first lateral section 134 and the lower side 122 of the encapsulant body 118 is different than the distance 150 between the second lateral section 140 and the lower side 122 of the encapsulant body 118. The distance 148 between the first lateral section 134 and the lower side 122 of the encapsulant body 118 is measured from a location 149 at which a lower surface of the first lateral section 134 intersects the first sidewall 124. The distance 150 between the second lateral section 140 and the lower side 122 of the encapsulant body 118 is measured from a location 151 at which a lower surface of the second lateral section 138 intersects the second sidewall 126.

In the depicted embodiment, the leads 116 are vertically offset such that the first lateral section 134 of the first lead 132 is vertically spaced further away from the lower side 122 of the encapsulant body 118 than the second lateral section 140 of the second lead 138 is from the lower side 122 of the encapsulant body 118.

In the depicted embodiment, the first lateral section 134 intersects the first sidewall 124 at an upper corner of the packaged semiconductor device 100. In other words, the first lateral section 134 is vertically spaced as close to the upper side 120 of the encapsulant body 118 as possible. In the case that the first lateral section 134 is oriented parallel to the upper side 120 of the encapsulant body 118, this means that an upper surface of the first lateral section 134 is coplanar with the upper side 120 of the encapsulant body 118.

According to an embodiment, the second lateral section 140 intersects the second sidewall 126 approximately around the center of the second sidewall 126. This means that an upper surface of the second lateral section 140 is vertically offset from the upper side 120 of the encapsulant body 118 by roughly the same distance that a lower surface of the second lateral section 140 is vertically offset from the lower side 122 of the encapsulant body 118. More generally, the second lateral section 140 can intersect the second sidewall 126 at any location that is vertically offset from the intersection between the first lateral section 134 and the first sidewall 124.

According to an embodiment, a vertical displacement of the first lead 132 is greater than a vertical displacement of the second lead 138. This means that the distance between an uppermost surface 152 of the first lead 132 and a lowermost surface 154 of the first lead 132, as measured in the vertical direction (V), is greater than the distance between an uppermost surface 156 of the second lead 138 and a lowermost surface 158 of the second lead 138, as measured in the vertical direction (V). In the depicted embodiment, the vertical displacement of the first lead 132 is attributable to the vertical extension of the first vertical section 136 of the first lead 132, and the vertical displacement of the second lead 138 is attributable to the vertical extension of the second vertical section 142 of the second lead 138. This difference in vertical extension creates the differing vertical displacement, as the other portions of the leads 116 do not have any vertical component. More generally, the vertical displacement of any portions of the leads can be tailored so that both the first and second lead 136, 138 extend at least to the lower side 122 of the encapsulant body 118.

The die pad includes first and second vertical edge sides 160, 162 that are opposite from one another and extend between the die attach surface 128 and the outer surface 130. The first vertical edge side 160 is exposed from the first sidewall 124 of the encapsulant body 118. That is, the die pad 114 laterally extends from within the encapsulant body 118 to at least reach the first sidewall 124. For example, the first vertical edge side 160 can be substantially coplanar with the first sidewall. Alternately, the first vertical edge side 160 can extend past the first sidewall. The second vertical edge side 162 of the die pad 114 that is opposite the first vertical edge side 160 is insulated from the second sidewall 126 by a portion of the electrically insulating encapsulant body 118. That is, the die pad 114 does not laterally extend from within the encapsulant body 118 to reach the second sidewall 126.

According to an embodiment, the die attach surface 128 is a substantially planar surface that extends completely from the second vertical edge side 162 to the first sidewall 124 of the encapsulant body 118 along a single plane. Thus, the available area for mounting of the semiconductor die 102 extends completely from the second vertical edge side 162 of the die pad 114 to the first sidewall 124 of the encapsulant body 118. As a result, the semiconductor device package 100 offers improved space-efficiency in comparison to a so-called downset configurations, which requires a lateral region on either side of the die pad 114 for the encapsulation of the leads and wire bond connections. Indeed, as shown in the figure, the semiconductor die 102 can be located very close to the first sidewall 124. The distance between the semiconductor die 102 and the first sidewall 124 is only limited by the amount of distance needed to form encapsulant material between the semiconductor die 102 and the first sidewall 124, which is a function of the molding process.

In the depicted embodiment, a thickness of the die pad 114 is substantially uniform along a lateral section that extends from the second vertical edge side 162 to the first vertical edge side 160. That is, the die pad 114 is provided by a substantially uniform thickness piece of conductive material. This can be regarded as a "single gauge" design. The thickness of the die pad 114 refers to the distance between the die attach surface 128 and the outer surface 130 measured in the vertical direction (V). In this embodiment, the outer surface 130 of the die pad 114 extends completely from the second vertical edge side 162 to the first sidewall 124 of the encapsulant body 118. Thus, the available cooling surface area of this design is favorably improved in comparison to conventional designs in which encapsulant material is provided between the heat slug and the package edge at the surface, e.g., for adhesion to the heat slug.

Figure 2:
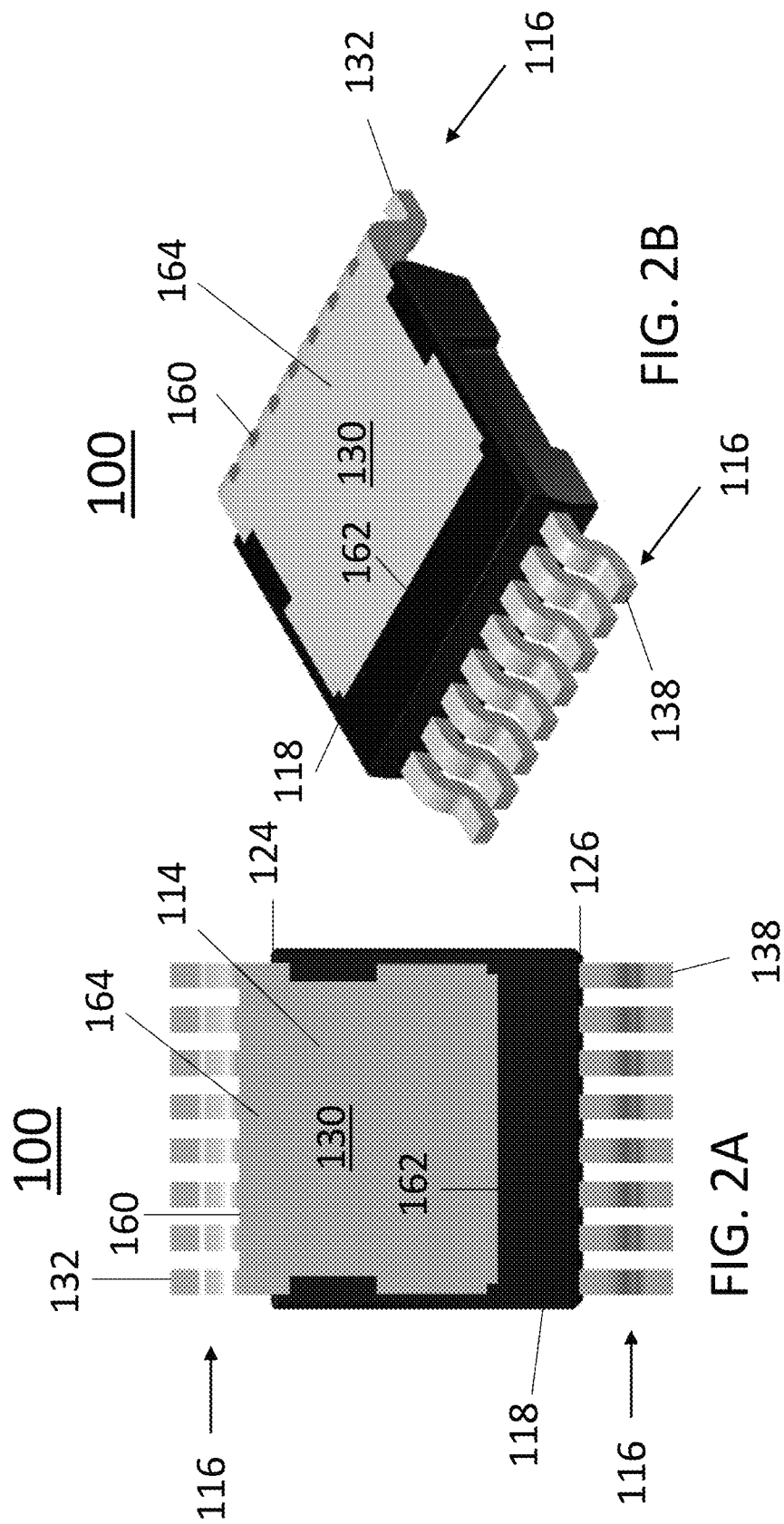
FIG. 2, which includes

Referring to FIG. 2, an embodiment of the semiconductor device package 100 as described with reference to FIG. 1 is shown from various top-side perspectives. As can be seen, the semiconductor device package 100 includes an integrally formed electrically conductive structure 164 disposed at the upper side 120 of the encapsulant body 118. This integrally formed electrically conductive structure 164 provides the die pad 114 for the mounting of the semiconductor die 102 as previously shown and described with reference to FIG. 1. In addition, this integrally formed structure provides a plurality of identically shaped first leads 132 extending away from the first sidewall 124 of the encapsulant body 118. Since each of these first leads 132 are part of the same structure, they provide a single package terminal (e.g., the drain) of the packaged device semiconductor device 100. In this example, the integrally formed electrically conductive structure 164 is configured so that the first vertical edge side 160 laterally extends past the first sidewall 124 of the encapsulant body 118. The semiconductor device package 100 additionally includes a plurality of identically shaped second leads 138 extending away from the second sidewall 126 of the encapsulant body 118. Each of these second leads 138 are detached from the die pad 114 and from each other. That is, the first lateral section 134 of each of these leads extends into the encapsulant body 118, is encapsulated by the encapsulant material, and is electrically insulated from other lead sections and from the integrally formed electrically conductive structure 164 by the mold material. As a result, different ones of the second leads 138 can provide different package terminals (e.g., source and drain) by use of bond wires.

Figure 3:
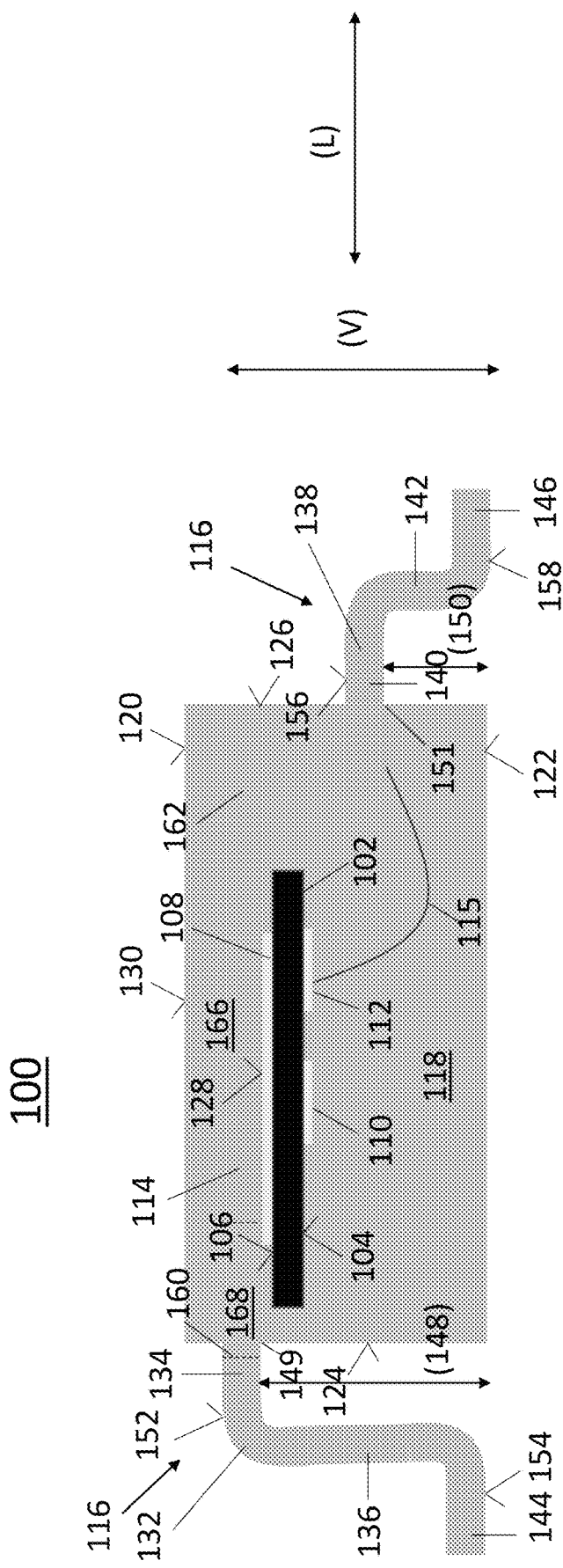
FIG. 3 depicts a cross-sectional view of a semiconductor device package, according to another embodiment.

Referring to FIG. 3, a semiconductor device package 100 is depicted, according to another embodiment. The semiconductor device package 100 is identical to the semiconductor device package 100 described with reference to FIG. 1, with the exception of the configuration of the die pad 114. Whereas the embodiment of FIG. 1 included a die pad 114 with a so-called "single gauge" design, the embodiment of FIG. 3 includes a die pad 114 with a so-called "dual gauge" design. According to this design, the die pad 114 includes a thicker central section 166 and a thinner first outer section 168. The central section 166 laterally extends from the second vertical edge side 162 to the first outer section 168. The first outer section 168 laterally extends from the central section 166 to the first vertical edge side 160. The central section 166 has a greater thickness than the first outer section 168. According to an embodiment, the central section 166 has a uniform thickness that is greater than a uniform thickness of the outer section 168. The thickness of the outer section 168 can be substantially similar or identical to the thickness of the first lead 132. In this embodiment, the outer surface 130 of the die pad 114 is exposed from the encapsulant body 118 at the central section 166, whereas a region of encapsulant material is provided between the first outer section 168 and the upper side 120 of the encapsulant body 118.

Figure 4:
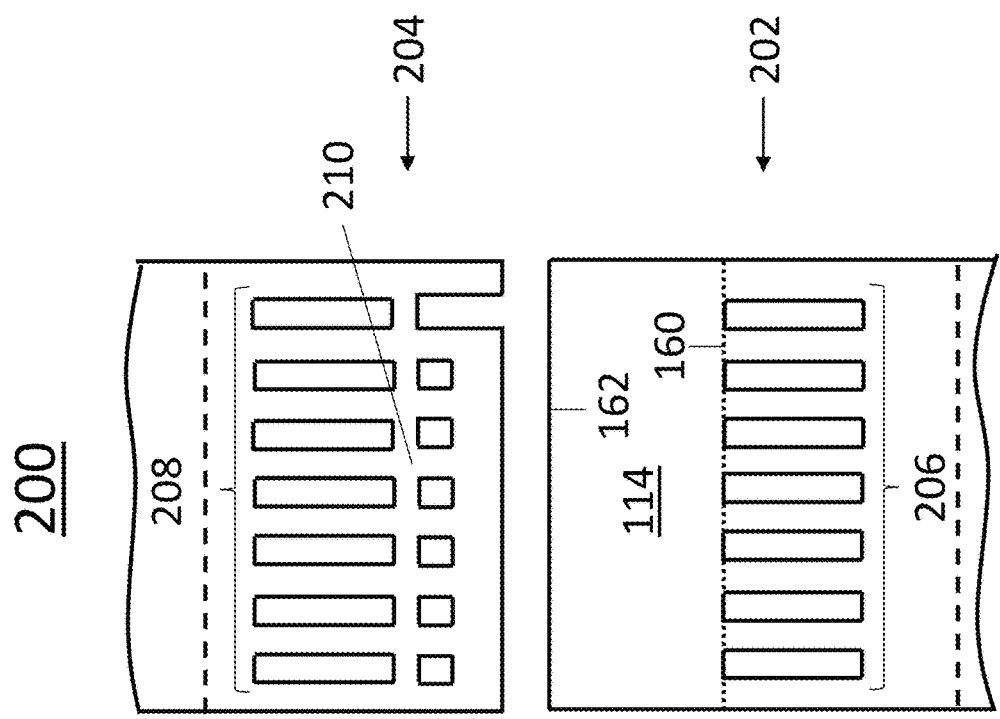
FIG. 4 depicts a lead frame that is used in a method of forming a packaged semiconductor device, according to an embodiment.

Referring to FIG. 4, a lead frame 200 that is used in a method for forming the semiconductor device package 100 is depicted, according to an embodiment. The lead frame 200 can be formed from an electrically conductive material. Exemplary materials for the lead frame 200 include metals such as copper, aluminum, nickel, iron, zinc, etc., and alloys thereof. The lead frame 200 can be formed from a layer of sheet metal, and the features depicted and described herein can be formed using conventional techniques such as stamping and etching. The lead frame 200 can be part of a lead frame strip that includes a plurality of identically configured lead frames 200 so that a plurality of the semiconductor device packages 100 can be formed in parallel.

The lead frame 200 includes a first lead frame section 202. The first lead frame section 202 includes the die pad 114 as previously described. The die pad 114 can have either the "single-gauge" configuration" as previously described with reference to FIG. 1 or the "dual-gauge" configuration as previously described with reference to FIG. 3. In addition, the first lead frame section 202 includes a first set 206 of leads 116. The first set 206 of leads are defined by regularly spaced windows in the first lead frame section 202. The first set 206 of leads directly connects with the die pad 114 at the first vertical edge side 160 of the die pad 114. In this example, the first set 206 of leads 116 and the die pad 114 are part of an integrally formed, continuous structure. The first set 206 of leads extends away from the first side of the die pad 114.

The lead frame 200 additionally includes a second lead frame section 204. The second lead frame section 204 includes a second set 208 of leads. The second set 208 of leads is defined by regularly spaced apart windows in the second lead frame section 204. The second lead frame section 204 additionally includes a dambar section 210 that traverses across the regularly spaced apart windows. The second lead frame section 204 is arranged to be laterally spaced apart from the die pad 114. That is, a gap is provided between the die pad 114 and an end second lead frame section 204 so that the two structures do not contact one another. The second lead frame section 204 is arranged such that the second set 208 of leads extends away from the second vertical edge side 162 of the die pad 114. That is, the second lead frame section 204 is arranged such that the second set 208 of leads extends away from the die pad 114 in an opposite direction as the first set 206 of leads.

Figure 5:
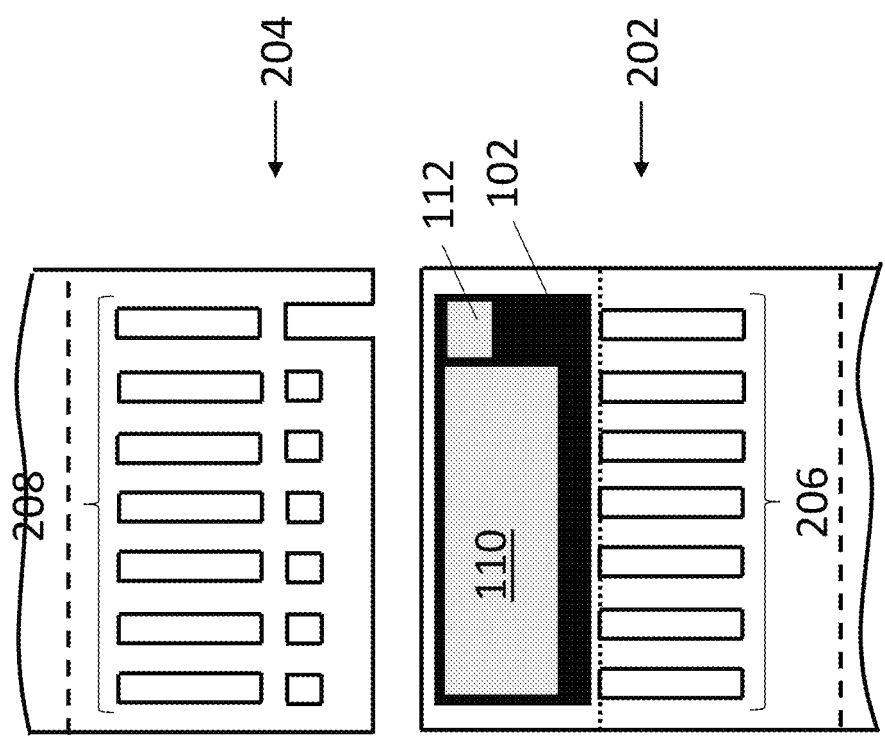
FIG. 5 depicts mounting a semiconductor die on the lead frame in a method of forming a packaged semiconductor device, according to an embodiment.

Referring to FIG. 5, a semiconductor die 102 is mounted on the die pad 114 of the lead frame 200. The semiconductor die 102 is mounted with the gate and source terminals 110, 112 facing away from the die pad 114. Further the drain terminal 108 faces and electrically connects to the die pad 114. This can be done using an electrically conductive adhesion technique, such as diffusion solder, glue bonding, etc.

Figure 6:
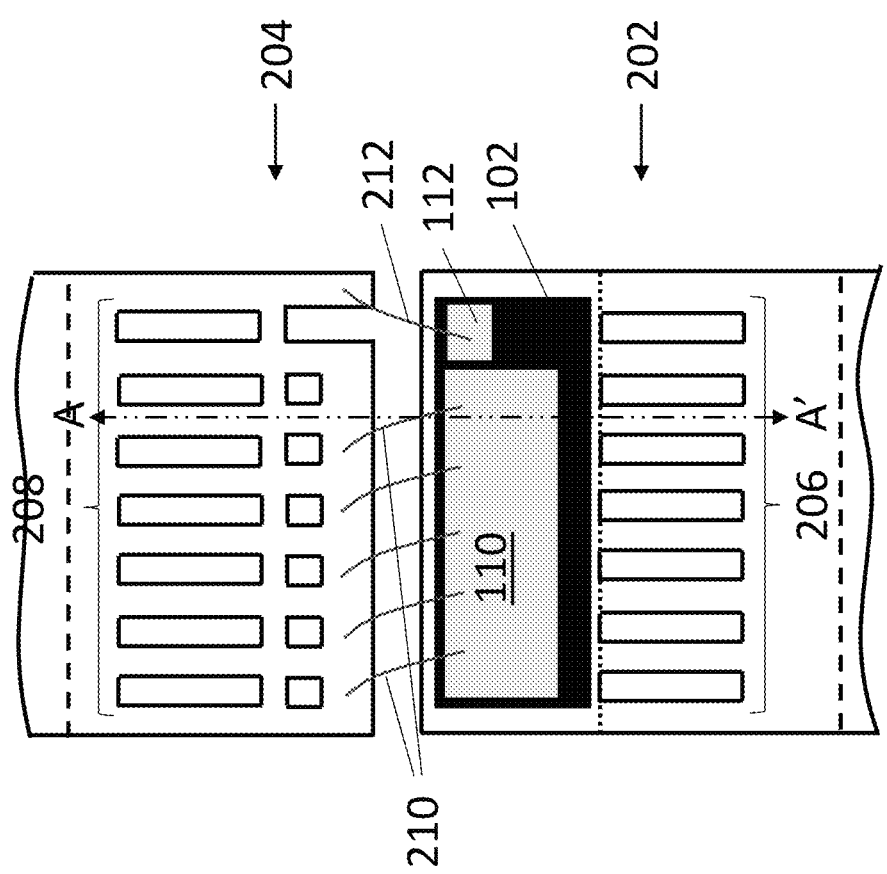
FIG. 6 depicts providing bond wires that electrically connect terminals of the semiconductor die to the lead frame in a method of forming a packaged semiconductor device, according to an embodiment.

Referring to FIG. 6, the semiconductor die 102 is electrically connected to the second set 208 of leads. More particularly, a first set 210 of bond wires electrically connects the source terminal 110 of the semiconductor die 102 to multiple ones of the leads in the second set 208 of leads. A second bond wire 212 connects the gate terminal 112 of the semiconductor die 102 to one of the leads in the second set 208 of leads that is isolated from the other leads. The bond wires of the first and second sets 210, 212 can be formed and attached according to known techniques.

Figure 7:
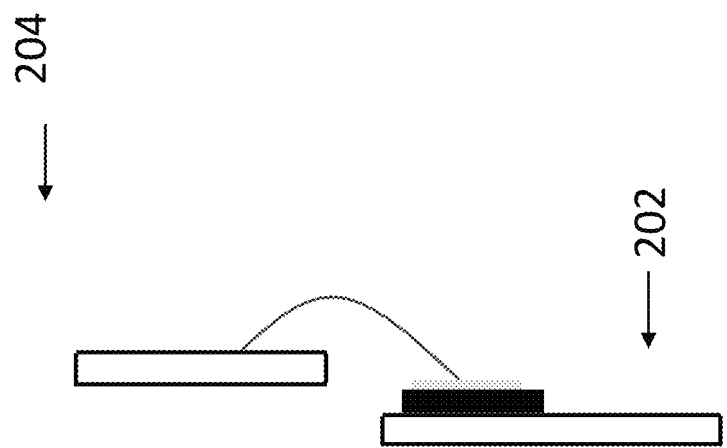
FIG. 7 depicts vertically offsetting a first portion of the lead frame from a second portion of the lead frame prior to encapsulation in a method of forming a packaged semiconductor device, according to an embodiment.

Referring to FIG. 7, the lead frame 200 is shown from the cross-sectional plane A-A' identified in FIG. 6. The lead frame 200 has been positioned such that the second lead frame section 204 is vertically offset from first lead frame section 202. This vertical offset can correspond to the vertical offset distance between the first lateral section 134 of the first lead 132 and the second lateral section 140 of the second lead 138, as previously described. The vertical offset is provided at any time in the process prior to the encapsulation of the semiconductor die 102, to be discussed immediately below.

Figure 8:
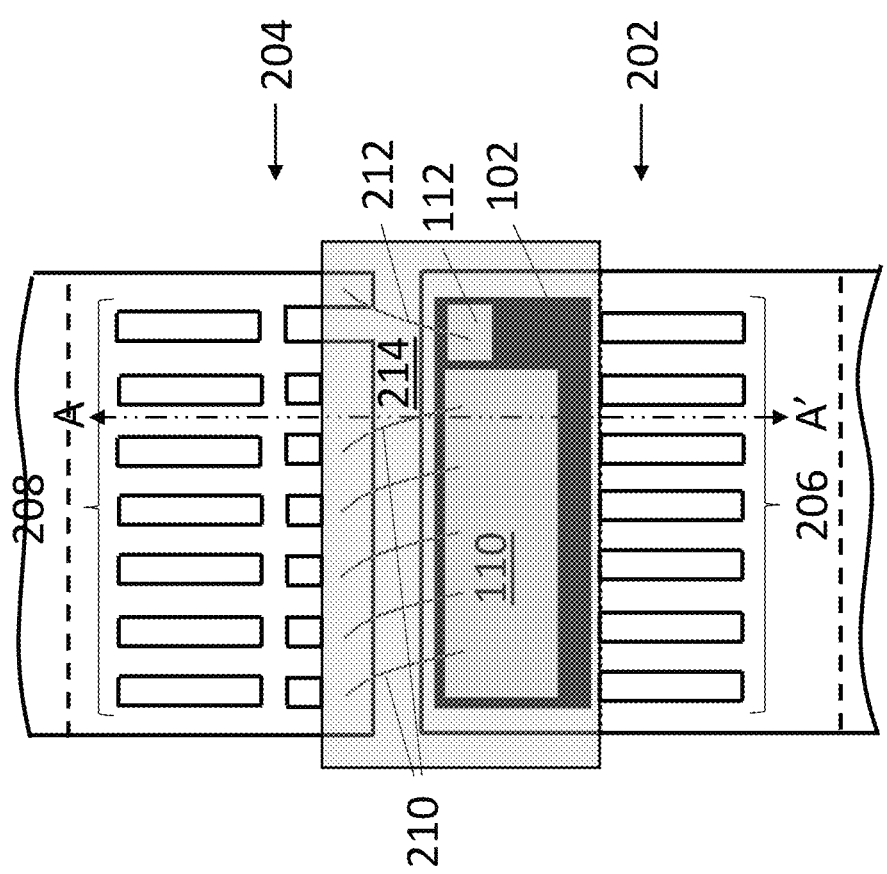
FIG. 8 depicts encapsulating the semiconductor die and wire bonds in a method of forming a packaged semiconductor device, according to an embodiment.

Referring to FIG. 8, an encapsulation process is performed. According to this technique, an electrically insulating encapsulant material 214 is formed on the first lead frame section 202 so as to encapsulate the semiconductor die 102 and the bond wires. The electrically insulating encapsulant material 214 is formed to have the geometry of the encapsulant body 118 as previously described. This can be done according any of a wide variety of known techniques including injection and transfer molding techniques. The encapsulant material 214 can include a wide variety of electrically insulating materials such as ceramics, epoxy materials and thermosetting plastics, to name a few. The encapsulation process is performed so that encapsulant material 214 covers a portion of the first lead frame section 202 that extends at least to the first edge side of the die pad 114. Moreover, the encapsulation process is performed so that the encapsulant material 214 covers a portion of second lead frame section 204. In this way, ends of the second set 208 of leads are encapsulated by and adhered to the encapsulant material 214.

Figure 9:
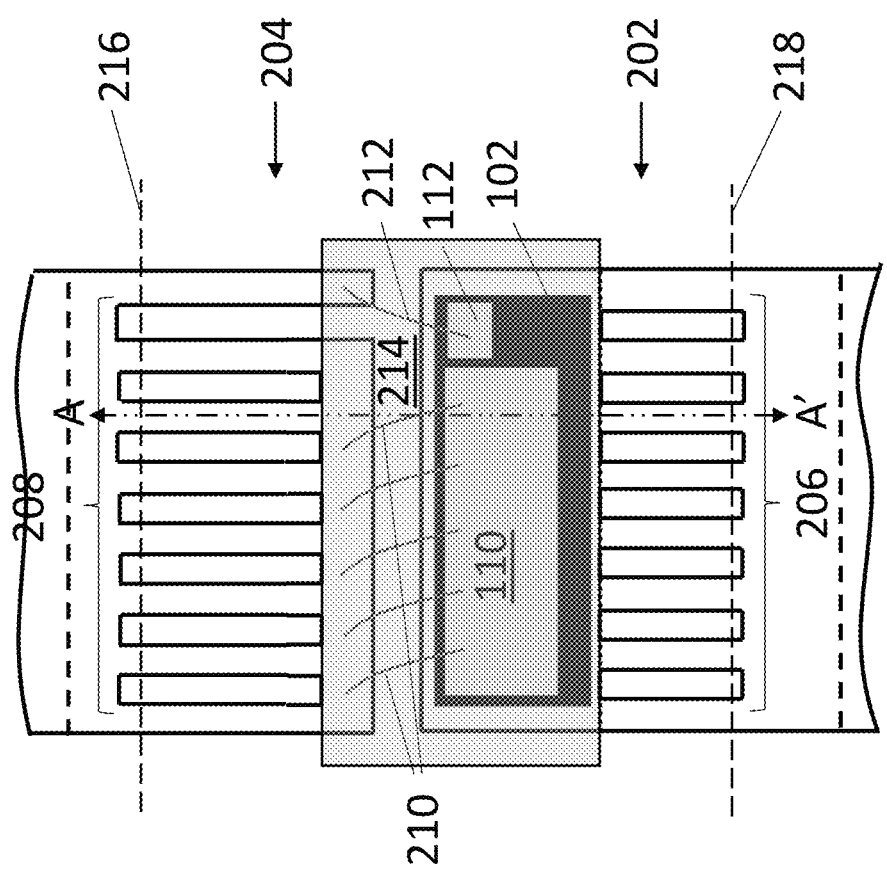
FIG. 9 depicts trimming the semiconductor leads in a method of forming a packaged semiconductor device, according to an embodiment.

Referring to FIG. 9, a trimming process is performed. In particular, the dambar section 210 that traverses across the regularly spaced apart windows is cut. After this dambar trimming is performed, a lead trimming process can be performed whereby the first and second lead frame sections 202, 204 are cut along the first and second cutting lines 216, 218 shown in FIG. 9. As a result, the device includes clearly defined leads extending away from either side of the encapsulant body 118. Moreover, the lead that connects to the gate terminal of the semiconductor die 102 is isolated from the other leads.

After the above described lead trimming process is performed, a lead bending process can be performed. This lead bending can be performed in such a way that the first set 206 of leads have the configuration of the first lead 132 as previously described. In addition, this lead bending process can be performed in such a way that the second set 208 of leads can have the configuration of the second lead 138 as previously described.

An embodiment of a semiconductor device package includes an electrically conductive die pad having a die attach surface and an outer surface opposite the die attach surface. A semiconductor die is mounted on the die attach surface. An encapsulant material encapsulates the semiconductor die and exposes the outer surface of the die pad at an upper side of the encapsulant material. A first lead directly contacts the die pad, extends away from a first sidewall of the encapsulant material, and bends towards a lower side of the encapsulant material that is opposite the upper side. A second lead is electrically connected to a terminal of the semiconductor die, extends away from a second sidewall of the encapsulant material that is opposite the first sidewall, and bends towards the lower side of the encapsulant material. A first lateral section of the first lead that intersects the first sidewall is vertically offset from a second lateral section of the second lead that intersects the second sidewall.

According an embodiment that can be combined with any other embodiment, the first lead further comprises a first vertical section that forms a bent intersection with the first lateral section and extends vertically towards the lower side of the package, wherein the second lead further comprises a second vertical section that forms a bent intersection with the second lateral section and extends vertically towards the lower side of the package, wherein a vertical extension of the first vertical section is greater than a vertical extension of the second vertical section.

According an embodiment that can be combined with any other embodiment, the first lateral section intersects the first sidewall at an upper corner of the packaged device such that an upper surface of the first lead in the first lateral section is coplanar with the upper side of the encapsulant material, and wherein the second lateral section intersects the second sidewall such that an upper surface of the second lead in the second lateral section is vertically offset from the upper side of the encapsulant material.

According an embodiment that can be combined with any other embodiment, the die pad comprises first and second vertical edge sides that are opposite from one another and extend between the die attach surface and the outer surface, and wherein the first vertical edge side is exposed from the first sidewall of the encapsulant material. According to any embodiment of the semiconductor device package, the second vertical edge side is insulated from the second sidewall by a portion of the encapsulant material, and wherein the die attach surface extends completely from the second vertical edge side to the first sidewall of the encapsulant material along a single plane. According to an embodiment of the semiconductor device package, the first lateral section of the first lead and the die pad are integrally formed together.

According an embodiment that can be combined with any other embodiment, a thickness of the die pad is substantially uniform along a lateral section that extends from the second vertical edge side to the first sidewall.

According an embodiment that can be combined with any other embodiment, the die pad comprises a central section and a first outer section laterally extending from the central section to the first sidewall of the encapsulant material, wherein a thickness of the die pad is greater in the central section than in the first outer section.

According an embodiment that can be combined with any other embodiment, the semiconductor die comprises a first terminal that directly faces and electrically connects to the die pad and a second terminal that is disposed on an opposite side of the semiconductor die as the first terminal, and wherein the second lateral section of the second lead is electrically connected to the second terminal of the semiconductor die by an electrically conductive wire.

An embodiment of a semiconductor device package includes a semiconductor die. An encapsulant material encapsulates the semiconductor die. An integrally formed electrically conductive structure provides a die pad and a first lead for the semiconductor device package. A second lead that is partially encapsulated by the encapsulant material and is detached from the die pad. The semiconductor die includes a first terminal that faces and is electrically connected to the die pad and a second terminal facing away from the die pad that is electrically connected to the second lead. The first and second leads intersect with first and second opposite facing sidewalls of the encapsulant material, respectively, at locations that are vertically offset from one another.

According an embodiment that can be combined with any other embodiment, a vertical displacement of the first lead is greater than a vertical displacement of the second lead.

According an embodiment that can be combined with any other embodiment, the integrally formed electrically conductive structure comprises a substantially uniform thickness section that provides the die pad and a first lateral section of the first lead that intersects with and extends away from the first sidewall.

According an embodiment that can be combined with any other embodiment, an outer surface of the substantially uniform thickness section is exposed from the encapsulant material and is coplanar with the upper side of the encapsulant material.

According an embodiment that can be combined with any other embodiment, the integrally formed electrically conductive structure comprises a thicker central section and a thinner first outer section, wherein an outer surface of the thicker central section is exposed from the encapsulant material and is coplanar with the upper side of the encapsulant material, and wherein the thinner first outer section extends to the first sidewall.

According an embodiment that can be combined with any other embodiment, the second lead is electrically connected to the second terminal by an electrically conductive bond wire.

An embodiment of method of forming a semiconductor device package includes providing an electrically conductive die pad having a die attach surface and an outer surface opposite the die attach surface. A semiconductor die is mounted on the die attach surface. An encapsulant material that encapsulates the semiconductor die and exposes the outer surface of the die pad at an upper side of the encapsulant material is formed. A first lead that directly contacts the die pad, extends away from a first sidewall of the encapsulant material, and bends towards a lower side of the encapsulant material that is opposite the upper side is provided. A second lead that is electrically connected to a terminal of the semiconductor die, extends away from a second sidewall of the encapsulant material that is opposite the first sidewall, and bends towards the lower side of the encapsulant material is provided.

According an embodiment that can be combined with any other embodiment, forming the semiconductor device package comprises providing a single lead frame comprising a first lead frame section and a second lead frame section, the first lead frame section comprising the die pad and a first set of leads connected to and extending away from a first side of the die pad the second lead frame section comprising a second set of leads; and arranging the second lead frame section to be laterally spaced apart from the die pad such that the second set of leads extend away from a second side of the die pad that is opposite the first side; wherein the first lead is provided from the first set of leads, and wherein the second lead is provided from the second set of leads.

According an embodiment that can be combined with any other embodiment, the second lead frame section is vertically offset from first lead frame section during formation of the encapsulant material.

According an embodiment that can be combined with any other embodiment, after mounting the semiconductor die to the die attach surface, the method further comprises providing electrically an electrically conductive bond wire that electrically connects the terminal of the semiconductor die to the second lead; and forming the encapsulant material on the lead frame such that the encapsulant material encapsulates the bond wires and extends to the first side of the die pad and to the second set of leads.

According an embodiment that can be combined with any other embodiment, after forming the electrically insulating encapsulant material, the method further comprises bending the first lead such that the first lead comprises a first vertical section that forms a bent intersection with the first lateral section and extends towards the lower side of the package; and bending the second lead such that the second lead comprises a second vertical section that forms a bent intersection with the second lateral section and extends towards the lower side of the package, and wherein a vertical extension of the first vertical section is greater than a vertical extension of the second vertical section.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

The term "heat sink" or "heat slug" or "heat spreader" are interchangeable in the context of the present specification, and each refer to a thermally conductive element that is configured to draw heat away from a heat source, e.g., an active semiconductor die.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device package, comprising:
a die pad comprising a die attach surface and an outer surface opposite the die attach surface;
a semiconductor die mounted on the die attach surface;
an encapsulant material that encapsulates the semiconductor die and exposes the outer surface of the die pad at an upper side of the encapsulant material;
a first lead that directly contacts the die pad, extends away from a first sidewall of the encapsulant material, and bends towards a lower side of the encapsulant material that is opposite the upper side; and
a second lead that is electrically connected to a terminal of the semiconductor die, extends away from a second sidewall of the encapsulant material that is opposite the first sidewall, and bends towards the lower side of the encapsulant material;
wherein an area of the die pad is larger than the semiconductor die, and
wherein the semiconductor die is mounted on the die pad such that semiconductor die is completely contained within an outer periphery of the die pad,
wherein the die pad comprises first and second vertical edge sides that are opposite from one another and each extend between the die attach surface and the outer surface,
wherein the first vertical edge side is disposed outside of the encapsulant material and is opposite from the second vertical edge side, and
wherein the die attach surface of the die pad extends from the second vertical edge to the first vertical edge side along a single plane.

2. The semiconductor device package of claim 1, wherein the first lead comprises a first lateral section that intersects the first sidewall, wherein the second lead comprises a second lateral section that intersects the second sidewall, wherein the first lead further comprises a first vertical section that forms a bent intersection with the first lateral section and extends vertically towards the lower side of the package, wherein the second lead further comprises a second vertical section that forms a bent intersection with the second lateral section and extends vertically towards the lower side of the package, and wherein a vertical extension of the first vertical section is greater than a vertical extension of the second vertical section.

3. The semiconductor device package of claim 2, wherein the first lateral section intersects the first sidewall at an upper corner of the packaged device such that an upper surface of the first lead in the first lateral section is coplanar with the upper side of the encapsulant material, and wherein the second lateral section intersects the second sidewall such that an upper surface of the second lead in the second lateral section is vertically offset from the upper side of the encapsulant material.

4. The semiconductor device package of claim 2, wherein the first lateral section of the first lead and the die pad are integrally formed together.

5. The semiconductor device package of claim 1, wherein a thickness of the die pad is substantially uniform along a lateral section that extends from the second vertical edge side to the first sidewall.

6. A semiconductor device package, comprising:
a semiconductor die;
an encapsulant material that encapsulates the semiconductor die;
an integrally formed electrically conductive structure that provides a die pad and a first lead for the semiconductor device package;
a second lead that is partially encapsulated by the encapsulant material and is detached from the die pad,
wherein the semiconductor die comprises a first terminal that faces and is electrically connected to the die pad and a second terminal facing away from the first terminal that is electrically connected to the second lead,
wherein the first and second leads intersect with first and second opposite facing sidewalls of the encapsulant material, respectively
wherein the integrally formed electrically conductive structure comprises a die attach surface and an outer surface opposite the die attach surface, wherein the outer surface of the integrally formed electrically conductive structure that is directly opposite from the semiconductor die is exposed from the encapsulant material, wherein an area of the die pad is larger than the semiconductor die, and wherein the semiconductor die is mounted on the die pad such that semiconductor die is completely contained within an outer periphery of the die pad, wherein the die pad comprises first and second vertical edge sides that are opposite from one another and each extend between the die attach surface and the outer surface, wherein the first vertical edge side is disposed outside of the encapsulant material and is opposite from the second vertical edge side, and wherein the die attach surface of the die pad extends from the second vertical edge to the first vertical edge side along a single plane.

7. The semiconductor device package of claim 6, wherein a vertical displacement of the first lead is greater than a vertical displacement of the second lead, the vertical displacement of the first lead being a distance between an uppermost surface of the first lead and a lowermost surface of the first lead, the vertical displacement of the second lead being a distance between an uppermost surface of the second lead and a lowermost surface of the second lead.

8. The semiconductor device package of claim 6, wherein the integrally formed electrically conductive structure comprises a substantially uniform thickness section that provides the die pad and a first lateral section of the first lead that intersects with and extends away from the first sidewall.

9. The semiconductor device package of claim 8, wherein an outer surface of the substantially uniform thickness section is exposed from the encapsulant material and is coplanar with the upper side of the encapsulant material.

10. The semiconductor device package of claim 1, wherein the second lead is electrically connected to the second terminal by an electrically conductive bond wire.

11. The semiconductor device package of claim 1, wherein the second lead is separated from the semiconductor die by a region of the encapsulant material, and wherein the second lead is electrically connected to the second terminal by an electrically conductive bond wire.

12. The semiconductor device package of claim 11, wherein an end of the second lead is laterally separated from an end of the semiconductor die in a lateral direction that is parallel to the upper side of the encapsulant material.

13. The semiconductor device package of claim 1, wherein the semiconductor device package comprises a plurality of the first leads, each of the first leads in the plurality directly contacting the die pad, extending away from the first sidewall of the encapsulant material, and bending towards the lower side of the encapsulant material, and wherein the first vertical edge side extends between two of the first leads from the plurality.

14. The semiconductor device package of claim 6, wherein the semiconductor device package comprises a plurality of the first leads, each of the first leads in the plurality directly contacting the die pad, extending away from the first sidewall of the encapsulant material, and bending towards the lower side of the encapsulant material, and wherein the first vertical edge side extends between two of the first leads from the plurality.

15. The semiconductor device package of claim 1, wherein a first lateral section of the first lead that intersects the first sidewall is vertically offset from a second lateral section of the second lead that intersects the second sidewall.

16. The semiconductor device package of claim 6, wherein the first and second leads intersect with the first and second opposite facing sidewalls of the encapsulant material, respectively, at locations that are vertically offset from one another.

17. The semiconductor device package of claim 1, wherein the semiconductor die comprises a first terminal that faces and is electrically connected to the die pad, wherein the semiconductor device package comprises a plurality of the first leads that each extend away from the first sidewall of the encapsulant material, and wherein the first terminal is exclusively electrically accessible by the first leads.

18. The semiconductor device package of claim 17, wherein the semiconductor die comprises a second terminal that faces away from the die pad, wherein the semiconductor die is configured as a transistor with the first and second terminals being the drain and source terminals, respectively, wherein the semiconductor device package comprises a plurality of the second leads that each extend away from the second sidewall of the encapsulant material, wherein the drain terminal is exclusively electrically accessible by the first leads, and wherein the source terminal is exclusively electrically accessible by the second leads.

* * * * *

UNITED STATES PATENT AND TRADEMARK OFFICE
CERTIFICATE OF CORRECTION

PATENT NO. : 10,840,164 B2
APPLICATION NO. : 15/983621
DATED : November 17, 2020
INVENTOR(S) : C. Hong et al.

Page 1 of 1

It is certified that error appears in the above-identified patent and that said Letters Patent is hereby corrected as shown below:

In the Claims

Column 15, Line 8 (Claim 6, Line 28) please change "that semiconductor" to -- that the semiconductor --

Signed and Sealed this
Twenty-third Day of February, 2021

Drew Hirshfeld
*Performing the Functions and Duties of the
Under Secretary of Commerce for Intellectual Property and
Director of the United States Patent and Trademark Office*